(12) United States Patent
Costello

(10) Patent No.: US 8,100,699 B1
(45) Date of Patent: Jan. 24, 2012

(54) CONNECTOR ASSEMBLY HAVING A CONNECTOR EXTENDER MODULE

(75) Inventor: Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/841,358

(22) Filed: Jul. 22, 2010

(51) Int. Cl.
*H01R 12/00* (2006.01)
*H05K 1/00* (2006.01)

(52) U.S. Cl. ........................................ 439/65; 439/541.5

(58) Field of Classification Search ................ 439/65, 439/541.5, 701, 79, 80, 74
See application file for complete search history.

(56) References Cited

U.S. PATENT DOCUMENTS

| | | | |
|---|---|---|---|
| 5,137,462 A * | 8/1992 | Casey et al. | 439/74 |
| 5,477,933 A | 12/1995 | Nguyen | |
| RE36,442 E | 12/1999 | Kardos | |
| 6,305,951 B1 * | 10/2001 | Shih et al. | 439/79 |
| 6,511,345 B1 * | 1/2003 | Hwang | 439/541.5 |
| 6,561,821 B1 * | 5/2003 | Yu | 439/74 |
| 6,695,622 B2 * | 2/2004 | Korsunsky et al. | 439/65 |
| 6,736,671 B2 * | 5/2004 | Lee | 439/541.5 |
| 6,814,590 B2 * | 11/2004 | Minich et al. | 439/79 |
| 2002/0137373 A1 * | 9/2002 | Billman et al. | 439/108 |
| 2011/0059625 A1 * | 3/2011 | Westman et al. | 439/55 |

* cited by examiner

*Primary Examiner* — Hae Moon Hyeon

(57) ABSTRACT

A connector assembly includes an electrical connector having a mating end configured to be mated to a mating connector and a mounting end. The electrical connector holds contacts with pins extending from the mounting end. The connector assembly also includes a connector extender module coupled to the mounting end. The connector extender module having a holder extending between a connector end and board end, with the mounting end of the electrical connector being mounted to the connector end and the board end being configured to be mounted to a circuit board. The holder has channels extending between the connector end and the board end. The connector extender module also includes terminals arranged within the channels that receive the pins. The terminals have tails configured to be terminated to the circuit board.

20 Claims, 3 Drawing Sheets

CONNECTOR ASSEMBLY HAVING A CONNECTOR EXTENDER MODULE

BACKGROUND OF THE INVENTION

The subject matter herein relates generally to electrical connectors and, more particularly, to electrical connectors configured for mounting on a circuit board.

Electrical connectors mechanically and electrically interconnect circuit boards and other electrical components. The electrical connectors are typically mounted to a circuit board and mated to a mating connector, which may be board mounted or cable mounted. Typically the circuit board, and thus the electrical connectors, is mounted within an electronic device at a particular location. In order to change the vertical position of the mating face of the electrical connector within the electronic device, either the position of the circuit board is changed within the electronic device, or the electrical connector is entirely redesigned to change the height of the electrical connector. However, such redesign of the electrical connector is costly as tooling for the connector housing as well as the contacts needs to be changed.

Thus, a need exists for a connector assembly that provides a cost effective and reliable connection to a circuit board. A need remains for a connector assembly that allows an electrical connector to be mounted at various heights above a circuit board.

BRIEF DESCRIPTION OF THE INVENTION

In one embodiment, a connector assembly is provided that includes an electrical connector having a mating end configured to be mated to a mating connector and a mounting end. The electrical connector holds contacts with pins extending from the mounting end. The connector assembly also includes a connector extender module coupled to the mounting end. The connector extender module having a holder extending between a connector end and board end, with the mounting end of the electrical connector being mounted to the connector end and the board end being configured to be mounted to a circuit board. The holder has channels extending between the connector end and the board end. The connector extender module also includes terminals arranged within the channels that receive the pins. The terminals have tails configured to be terminated to the circuit board.

In another embodiment, a connector assembly is provided including an electrical connector having a mating end configured to be mated to a mating connector and mounting end. The electrical connector holds a first set of contacts with pins extending from the mounting end and the electrical connector holds a second set of contacts with pins extending from the mounting end. The first and second sets of contacts are of different types and have different mating ends. The connector assembly also includes a connector extender module connected to the mounting end. The connector extender module has a holder extending between a connector end and a board end. The mounting end of the electrical connector is mounted to the connector end and the board end is configured to be mounted to a circuit board. The holder has channels extending between the connector end and the board end. The connector extender module has terminals arranged within the channels that receive the pins of the first and second sets of contacts. The terminals have tails configured to be terminated to the circuit board.

In a further embodiment, a connector assembly is provided including an electrical connector having a mating end configured to be mated to a mating connector and a mounting end. The electrical connector holds contacts with pins extending from the mounting end. The connector assembly also includes a first connector extender module and a second connector extender module. The first connector extender module has a first holder having a first height between a connector end and a board end. The first holder has channels extending between the connector end and the board end. The first connector extender module has first terminals arranged within the channels. The first terminals are configured to receive the pins and the first terminals have tails configured to be terminated to the circuit board. The second connector extender module has a second holder having a second height between a connector end and a board end. The second height is less than the first height. The second holder has channels extending between the connector end and the board end. The second connector extender module has second terminals that are shorter than the first terminals and that are arranged within the channels of the second holder. The second terminals are configured to receive the pins and the second terminals have tails configured to be terminated to the circuit board. Either the first connector extender module or the second connector extender module is selected to be positioned between the electrical connector and the circuit board to control the vertical height of the mating end of the electrical connector from the circuit board.

DETAILED DESCRIPTION OF THE INVENTION

Figure 1:
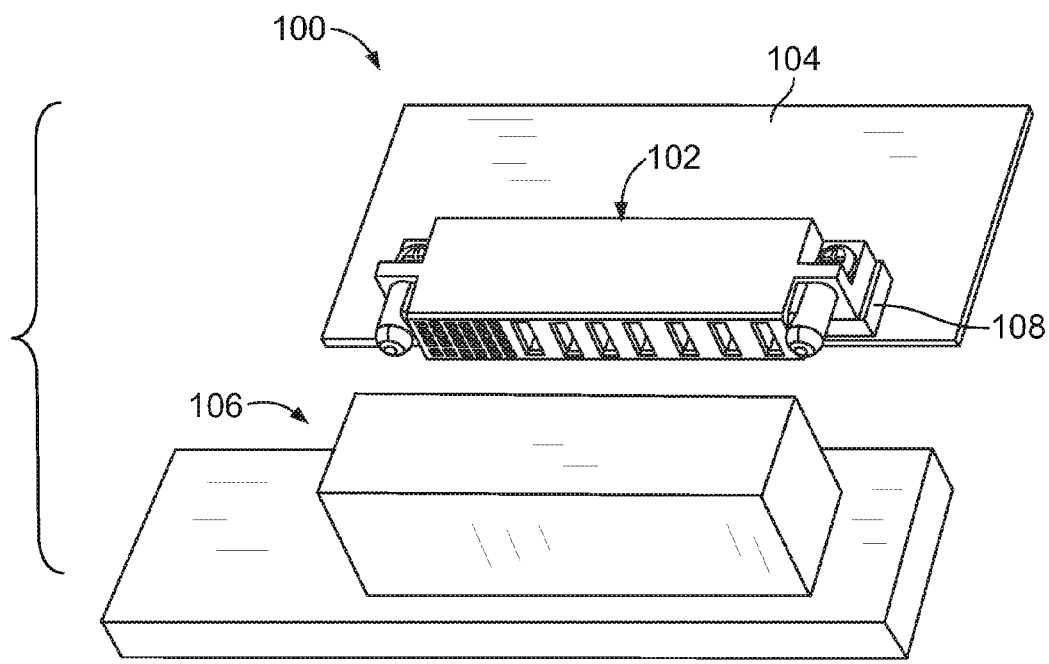
FIG. 1 illustrates a connector assembly formed in accordance with an exemplary embodiment.
Figure 2:
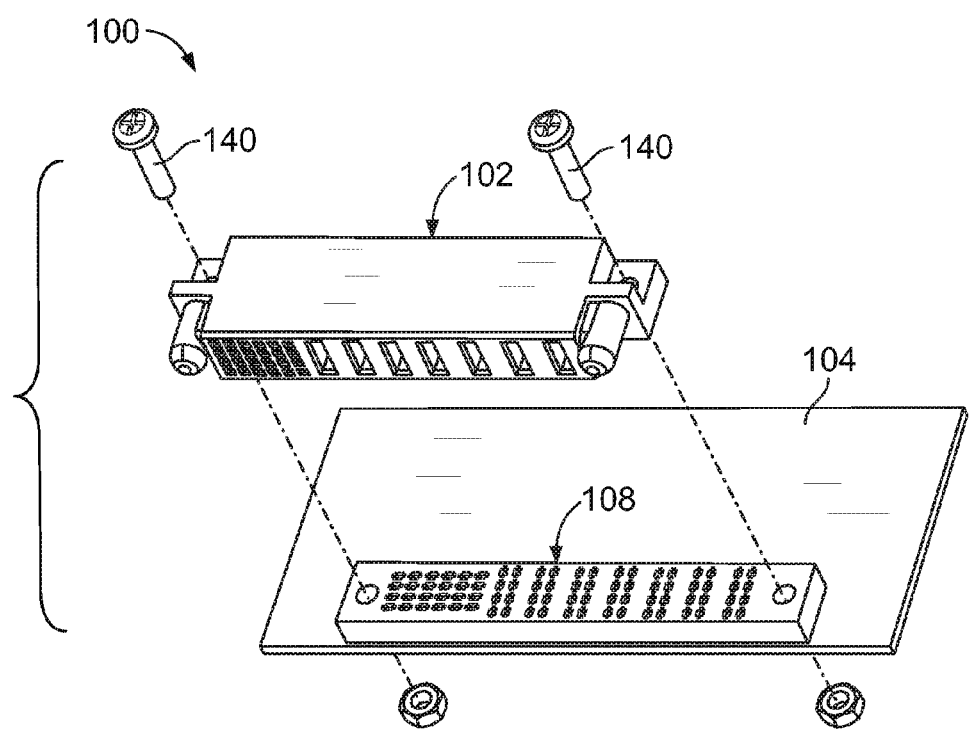
FIG. 2 is an exploded view of the connector assembly shown in FIG. 1.

FIG. 1 illustrates a connector assembly 100 according to one embodiment in an assembled state. FIG. 2 illustrates the connector assembly 100 in an exploded state. The connector assembly 100 includes an electrical connector 102 that mechanically and electrically connects a circuit board 104 and a mating connector 106, which may be connected to a second circuit board or another electronic device.

The connector assembly 100 includes a connector extender module 108 arranged between the electrical connector 102 and the circuit board 104. The connector extender module 108 electrically interconnects the electrical connector 102 and the circuit board 104. The electrical connector 102 is configured to be mated to the mating connector 106 to electrically and mechanically couple the circuit board 104 to the mating connector 106 via the connector extender module 108.

Figure 3:
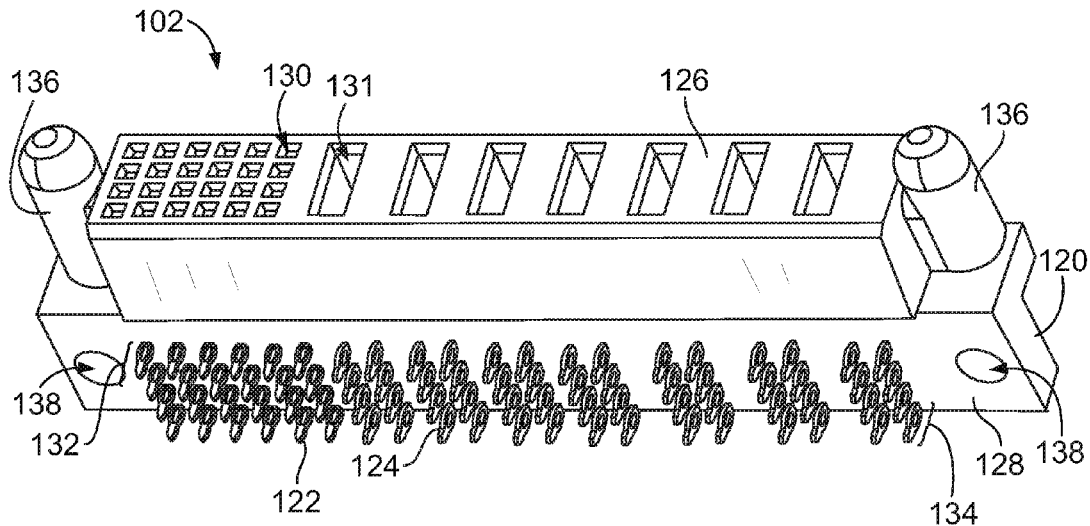
FIG. 3 is a bottom perspective view of an electrical connector of the connector assembly shown in FIG. 1.

FIG. 3 is a bottom perspective view of the electrical connector 102. The electrical connector 102 includes a housing 120 holding a plurality of signal contacts 122 and power contacts 124. Optionally, the electrical connector 102 may include other types of contacts, such as ground contacts. In alternative embodiments, the electrical connector 102 may include a single type of contact, such as the signal contacts 122 or the power contacts 124.

The housing 120 includes a mating end 126 and a mounting end 128. Optionally, the mating and mounting ends 126, 128 may be generally perpendicular to one another. The electrical connector 102 thus constitutes a right angle connector. Alternatively, the mating and mounting ends 126, 128 may have other arrangements, such as a being parallel to one another at opposite ends of the housing 120. The signal and power contacts 122, 124 are arranged at the mating end 126 for mating engagement with the mating connector 106 (shown in FIG. 1). The signal and power contacts 122, 124 are arranged at the mounting end 128 for mounting to the connector extender module 108 (shown in FIGS. 1 and 2). The housing 120 includes a plurality of contact channels 130, 131 that receive the signal contacts 122 and the power contacts 124, respectively. The contact channels 130, 131 are configured to receive corresponding contacts of the mating connector 106. The signal and power contacts 122, 124 are arranged within the contact channels 130, 131 for mating engagement with the mating contacts of the mating connector 106. In an exemplary embodiment, the contact channels 130 are sized and shaped differently than the contact channels 131. The size and shape of the contact channels 130, 131 correspond to the size and shape of the signal contacts 122 and the power contacts 124. For example, the contact channels 131 are larger than the contact channels 130. The contact channels 130 are arranged in a plurality of rows and a plurality of columns with the rows of contact channels 130 being arranged at different vertical heights along the mating end 126. The contact channels 130 are stacked on top of one another at different vertical heights along the mating end 126. The contact channels 131 are arranged in a single row, however the contact channels 131 may be arranged in multiple rows.

The signal contacts 122 include pins 132 extending from the mounting end 128. Optionally, the pins 132 may constitute compliant pins, such as eye-of-the-needle pins. The pins 132 may have a different interface in alternative embodiments. The pins 132 are arranged in a plurality of rows and a plurality of columns with the rows being positioned at different depths from a front of the housing 120. Optionally, the rows of the pins 132 may be staggered.

The power contacts 124 include pins 134 extending from the mounting end 128. Optionally, the pins 134 may be oriented approximately perpendicular to the pins 132. The pins 134 may constitute compliant pins, such as eye-of-the-needle pins. The pins 134 may have a different interface in alternative embodiments.

In an exemplary embodiment, the signal and power contacts 122, 124 are overmolded during a manufacturing process to form the housing 120. As such, portions of the signal and power contacts 122, 124 may be embedded within the housing 120. Alternatively, the signal and power contacts 122, 124 may be loaded into the housing 120 after the housing 120 is formed, such as by loading individual signal or power contacts 122, 124 or groups of signal and power contacts 122, 124 into the housing 120, such as through the rear of the housing 120.

The housing 120 includes alignment posts 136 extending from a front of the housing 120 adjacent the mating end 126 for aligning the electrical connector 102 and the mating connector 106 during mating. Alternatively, rather than alignment posts 136, different alignment features may be utilized. For example, the housing 120 may have latch receiving features to enable the attachment of a latching cable mounted connector or it may have no additional alignment features at all. The housing 120 includes mounting features 138 for mounting the electrical connector 102 to the circuit board 104 and/or the connector extender module 108 (both shown in FIG. 1). In the illustrated embodiment, the mounting features 138 constitute openings through the housing 120 that are configured to receive fasteners 140 (shown in FIG. 2). Alternative types of mounting features may be utilized in alternative embodiments.

The mounting end 128 may be generally planar. The signal contacts 122 are arranged in a first zone and the power contacts 124 are arranged in a second zone separate from the first zone. For example, the signal contacts 122 may be arranged toward one side of the housing 120 while the power contacts 124 may be arranged toward the other side. Optionally, another set of signal contacts 122 may be arranged on the opposite side of the power contacts 124. Alternatively, or additionally, another set of power contacts 124 may be arranged on the opposite side of the signal contacts 122. Optionally, shielding may be provided between the signal contacts 122 and the power contacts 124.

Figure 4:
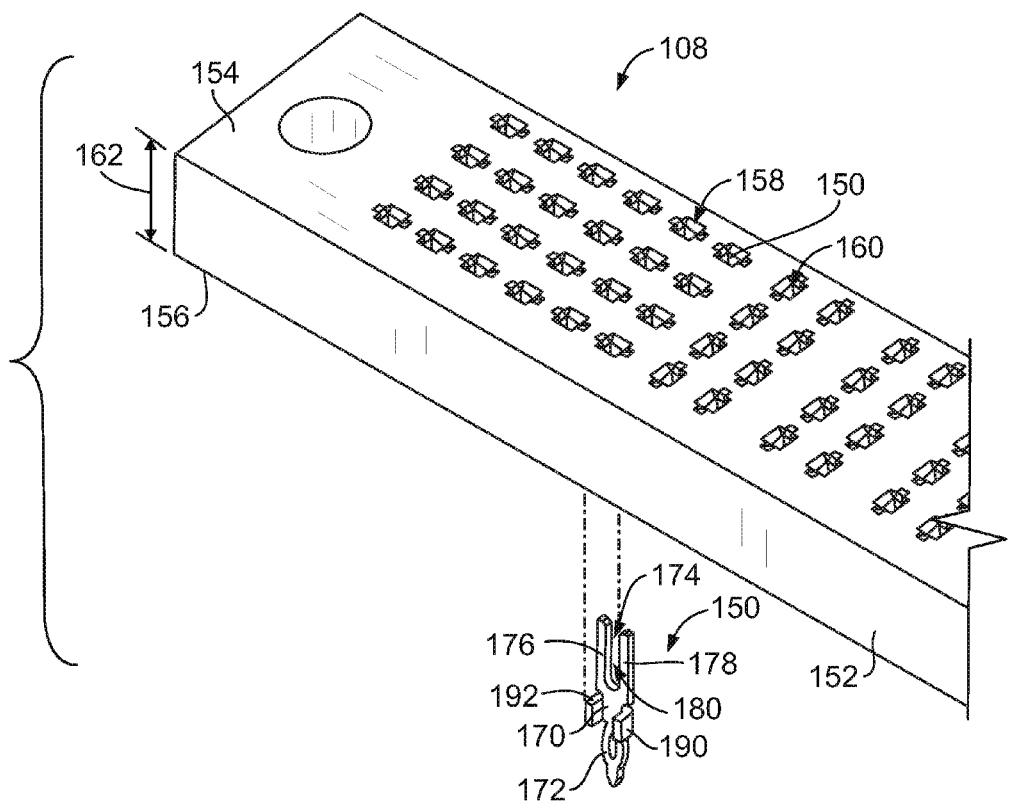
FIG. 4 is a top perspective view of a connector extender module for the connector assembly shown in FIG. 1.

FIG. 4 illustrates the connector extender module 108 with a terminal 150 poised for loading into the connector extender module 108. The connector extender module 108 includes a holder 152 extending between a connector end 154 and a board end 156. The electrical connector 102 (shown in FIG. 3) is configured to be mounted to the connector end 154. The board end 156 is configured to be mounted to the circuit board 104 (shown in FIGS. 1 and 2).

The holder 152 includes a plurality of channels 158 and 160 extending between the connector end 154 and the board end 156. Terminals 150 are received in corresponding channels 158, 160. The channels 158 are configured to receive the signal contacts 122 (shown in FIG. 3). The channels 160 are configured to receive the power contacts 124 (shown in FIG. 3).

The holder 152 has a height 162 measured between the connector end 154 and the board end 156. In an exemplary embodiment, different connector extender modules 108 having different heights 162 are designed for use with the connector assembly 100. The different height connector extender modules 108 allow the vertical height of the electrical connector 102 to be varied with respect to the circuit board 104.

The connector end 154 and the board end 156 are generally planar and parallel to one another. Alternatively, the connector end 154 and/or the board end 156 may be non-planar, such as by including one or more steps that vary the height 162 along the length thereof.

The channels 158, 160 extend along center lines. The channels 158 have a predetermined center line pitch between the rows and a predetermined center line pitch between the columns. The channels 160 have a predetermined center line pitch between the rows and a predetermined center line pitch between the columns. Optionally, the center line pitch between the rows of the channels 160 may be the same as the center line pitch between the rows of the channels 158, however the pitch between the columns of the channels 160 may be different than the pitch between the columns of the channels 158.

The terminals 150 include a main body 170 having a tail 172 extending from one end of the main body 170 and a receptacle 174 extending from the other end of the main body 170. The tail 172 is configured to be mounted to the circuit board 104. In the illustrated embodiment, the tail 172 constitutes a compliant portion, such as an eye-of-the-needle tail, configured to be received within a plated via in the circuit board 104. The tail 172 may have an alternative shape or configuration in alternative embodiments, such as a surface mountable tail configured to be surface mounted to the circuit board, such as by soldering.

In an exemplary embodiment, the receptacle 174 constitutes a tuning fork type portion configured to receive one of the pins 132 or 134 (shown in FIG. 3) of the signal or power contacts 122, 124 (shown in FIG. 3). Other types of receptacles may be used in alternative embodiments, such as box-shaped socket contacts, cylindrical socket contacts, or other types of contacts. Rather than receptacles, the terminals 150 may have spring beams or other mating interfaces for mating with the signal and power contacts 122, 124.

In an exemplary, the receptacle 174 includes a first beam 176 and a second beam 178 separated by a gap 180. The gap 180 receives one of the pins 132, 134 between the first and second beams 176, 178. The beams 176, 178 engage the corresponding pins 132, 134 received in the gap 180. An electrical connection is created between the receptacle 174 and the corresponding pins 132, 134. Optionally, the first and second beams 176, 178 may be spring biased against the pins 132, 134 when received therein. The first and second beams 176, 178 are spaced apart to form the gap 180, which simulates a plated via in a circuit board. For example, the first and second beams 176, 178 may be spaced apart by a dimension equivalent to a diameter of a plated via in a circuit board. Optionally, different connector extender modules 108 may be provided with different sized terminals 150 having different spacing between the first and second beams 176, 178, simulating different diameter plated vias. For example, one embodiment may have the first and second beams 176, 178 spaced apart by 0.6 mm simulating a 0.6 mm hole in a circuit board. Another embodiment may have the first and second beams 176, 178 separated by a distance of 0.56 mm representing a 0.56 mm hole in a circuit board. Another embodiment may have the first and second beams 176, 178 separated by distance of 0.46 mm representing a 0.46 mm hole in a circuit board. Other dimensions are possible in alternative embodiments.

In an exemplary embodiment, the terminals 150 received in the channels 158 are identical to the terminals 150 received in the channels 160. As such, each terminal 150 may be a stock item configured to receive both the pins 132 of the signals contacts 122 and the pins 134 of the power contacts 124. Different terminals 150 do not need to be provided for the signal contacts 122 and for the power contacts 124. Alternatively, different types of terminals 150 may be used for the signal contacts 122 and for the power contacts 124. For example, the different types of terminals may be sized differently, or shaped differently.

The terminal 150 includes a pair of tabs 190 extending from the main body 170. The tabs 190 include shoulders 192. In an exemplary embodiment, the tabs 190 are bent out of plane with the main body 170. Optionally, both tabs 190 may be bent in the same direction from the main body 170. In an alternative embodiment, the tabs 190 may not be bent, but rather may remain within the same plane as the main body 170. In other alternative embodiments, one tab 190 may be bent in one direction, while the other tab 190 may be bent in the opposite direction from the main body 170. Optionally, more or less than two tabs 190 may be provided. In an exemplary embodiment, the terminal 150 is a stamped and formed part, having the tabs 190 bent during a manufacturing step, such as to the position shown in FIG. 4. During assembly, when the terminal 150 is loaded into the channels 158, 160, the terminal 150 is pressed into the channels 158, 160 until the shoulders 192 bottom out within the channels 158, 160. The shoulders 192 define a stop surface for loading the terminal 150 into the corresponding channels 158, 160. For example, the channels 158, 160 may include an internal shoulder therein that defines a stop, wherein the terminals 150 are loaded into the channels 158, 160 until the shoulders 192 engage the internal shoulder of the corresponding channel 158, 160.

In an exemplary embodiment, the terminals 150 loaded into the channels 158 are arranged in a first direction having the first and second beams 176, 178 arranged along a longitudinal axis of the holder 152. The terminals 150 loaded into the channels 160 are arranged generally perpendicular with respect to the terminal 150 loaded into the channels 158. For example, the terminals 150 loaded into the channels 160 are arranged such that the first and second beams 176, 178 are aligned along a lateral axis of the holder 152. Different arrangements or configurations of the terminals 150 are possible in alternative embodiments. When the terminals 150 are loaded into the channels 158, 160, the distal ends of the first and second beams 176, 178 are arranged adjacent to the connector end 154 of the holder 152. Optionally, the distal ends of the first and second beams 176, 178 may be substantially flush with the connector end 154. When the terminals 150 are loaded into the channels 158, 160, the tails 172 extend outward from the board end 156. The tails 172 extend beyond the board end 156 for mounting to the circuit board 104. For example, the tails 172 are configured to be received in plated vias of the circuit board 104.

Figure 5:
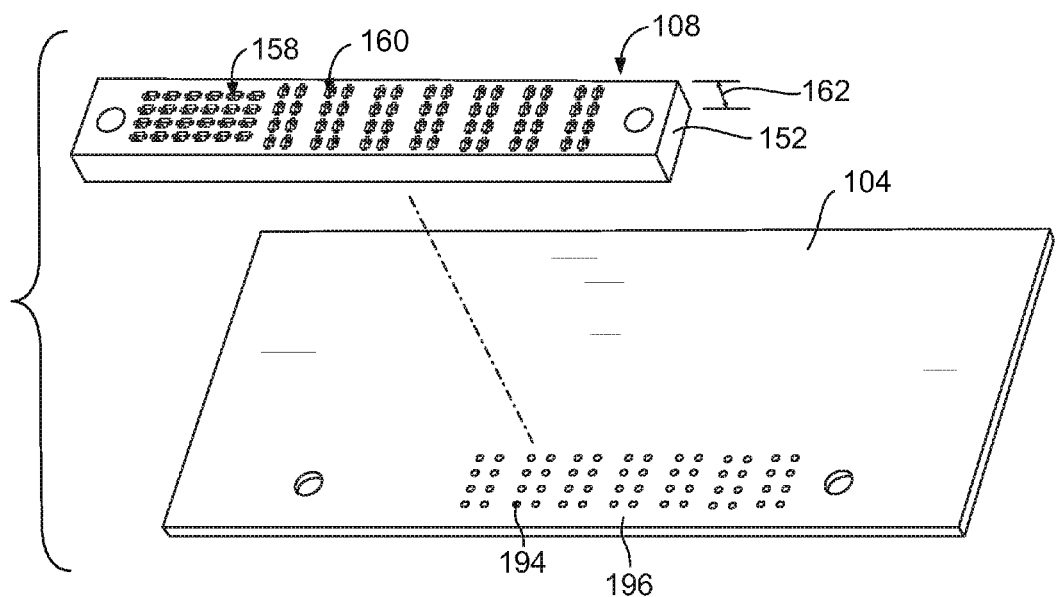
FIG. 5 illustrates the connector extender module poised for mounting to a circuit board.

FIG. 5 is an exploded view of the connector extender module 108 poised for mounting to the circuit board 104. The channels 158, 160, and thus the terminals 150, are arranged in a footprint pattern that is the same as a footprint pattern of vias 194 in the circuit board 104. Having the footprint pattern of the connector extender module 108 the same as the footprint pattern of the circuit board 104 allows the connector extender module 108 to be selectively utilized. For example, the electrical connector 102 (shown in FIG. 3) may be directly mounted to the circuit board 104 or the connector extender module 108 may be positioned between the electrical connector 102 and the same circuit board 104. Neither the electrical connector 102 nor the circuit board 104 need be altered or changed for the connector extender module 108 to be utilized. When the connector extender module 108 is used, the electrical connector 102 is elevated higher above a first surface 196 of the circuit board 104.

In an exemplary embodiment, a family of connector extender modules 108 may be provided, each having the same footprint pattern, however having holders 152 that have different heights 162 and different height terminals 150. The electrical connector 102 may be positioned at different vertical positions with respect to the first surface 196 of the circuit board 104 by utilizing different connector extender modules having different height holders. Optionally, more than one connector extender module 108 may be stacked together to increase the vertical height of the electrical connector 102 above the circuit board 104. The connector extender modules 108 plug directly into one another with the tails 172 (shown in FIG. 4) of the upper connecter extender module 108 being received in the receptacles 174 (shown in FIG. 4) of the lower connector extender module 108. The housing 120 and corresponding contacts 122, 124 do not need to be redesigned and retooled in order to position the mating end 126 at different vertical positions above the first surface 196 of the circuit board 104. Rather, different connector extender modules 108 may be provided. The heights 162 of the holder 152 may be easily varied without drastic or expensive retooling.

Figure 6:
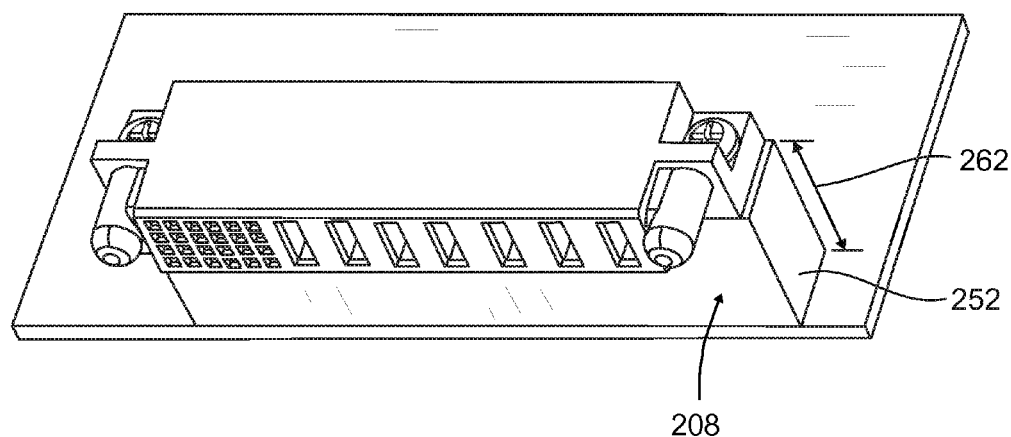
FIG. 6 illustrates the connector assembly with an alternative connector extender module.

FIG. 6 illustrates an alternative connector extender module 208. The connector extender module 208 includes a holder 252 that holds a plurality of terminals. The terminals of the connector extender module may have a similar shape (e.g. main body, tail, and receptacle), however the terminal may be longer. For example, the main body may be longer, but the tail and receptacle identical to the tail 172 and receptacle 174 (shown in FIG. 4).

The holder 252 has a height 262 that is substantially greater than the height 162 of the holder 152 (both shown in FIG. 4). Other types of connector extender modules 208 having different heights may be provided to create a family of connector extender modules usable with the connector assembly 100 (shown in FIG. 1).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
an electrical connector having a mating end configured to be mated to a mating connector and a mounting end, the electrical connector holding contacts with pins extending from the mounting end; and
a connector extender module coupled to the mounting end, the electrical connector holds different types of contacts; the connector extender module having a holder extending between a connector end and a board end, the mounting end of the electrical connector being mounted to the connector end, the board end being configured to be mounted to a circuit board, the holder having channels extending between the connector end and the board end, the connector extender module having terminals arranged within the channels, the terminals receive the pins, the terminals having tails configured to be terminated to the circuit board, the terminals being identical to one another and being configured to mate with the different types of contacts.

2. The connector assembly of claim 1, wherein the channels extend along center lines, the channels being arranged in a footprint pattern the same as a footprint pattern of the pins.

3. The connector assembly of claim 1, wherein the contacts comprise signal contacts and power contacts, the signal contacts having different mating ends than the power contacts for mating with the mating connector, the signal contacts and power contacts having similar pins, the terminals being configured to receive the pins of the signal contacts or the power contacts depending on the location of the terminal within the holder.

4. The connector assembly of claim 1, wherein the connector end of the holder defines a first mounting zone and a second mounting zone, the contacts comprise signal contacts and power contacts, the signal contacts being arranged in a group in the first mounting zone, the power contacts being arranged in a group in the second mounting zone.

5. The connector assembly of claim 1, wherein the terminals have receptacles opposite the tails, the receptacles each include a pair of spring beams separated by a gap, the gap receiving the pins and the spring beams engaging the pins, the gap simulating dimensions of a plated via in a circuit board.

6. The connector assembly of claim 1, wherein the holder has a height and the terminals have heights corresponding to the height of the holder, the heights of the holder and terminals being variable to vary a vertical position of the mating end of the electrical connector with respect to the circuit board.

7. The connector assembly of claim 1, wherein the terminals have receptacles opposite the tails, the receptacles receive the pins.

8. A connector assembly comprising:
an electrical connector having a mating end configured to be mated to a mating connector and a mounting end, the electrical connector holding a first set of contacts with pins extending from the mounting end and the electrical connector holding a second set of contacts with pins extending from the mounting end, the first and second sets of contacts being of different types and having different mating ends; and
a connector extender module coupled to the mounting end, the connector extender module having a holder extending between a connector end and a board end, the mounting end of the electrical connector being mounted to the connector end, the board end being configured to be mounted to a circuit board, the holder having channels extending between the connector end and the board end, the connector extender module having terminals arranged within the channels, the terminals receive the pins of the first and second sets of contacts, the terminals having tails configured to be terminated to the circuit board.

9. The connector assembly of claim 8, wherein the channels extend along center lines, the channels being arranged in a footprint pattern the same as a footprint pattern of the pins.

10. The connector assembly of claim 8, wherein the contacts comprise signal contacts and power contacts, the signal contacts having different mating ends than the power contacts for mating with the mating connector, the signal contacts and power contacts having similar pins, the terminals being configured to receive pins of the signal contacts or the power contacts depending on the location of the terminal within the holder.

11. The connector assembly of claim 8, wherein the connector end of the holder defines a first mounting zone and a second mounting zone, the contacts comprise signals contacts and power contacts, the signal contacts being arranged in a group in the first mounting zone, the power contacts being arranged in a group in the second mounting zone.

12. The connector assembly of claim 8, wherein the terminals have receptacles opposite the tails, the receptacles receive the pins.

13. The connector assembly of claim 8, wherein the terminals have receptacles opposite the tails, the receptacles each include a pair of spring beams separated by a gap, the gap receiving the pins and the spring beams engaging the pins, the gap simulating dimensions of a plated via in a circuit board.

14. The connector assembly of claim 8, wherein the holder has a height and the terminals have heights corresponding to the height of the holder, the heights of the holder and terminals being variable to vary a vertical position of the mating end of the electrical connector with respect to the circuit board.

15. A connector assembly comprising:
an electrical connector having a mating end configured to be mated to a mating connector and a mounting end, the electrical connector holding contacts with pins extending from the mounting end;
a first connector extender module having a first holder having a first height between a connector end and a board end, the first holder having channels extending between the connector end and the board end, the first connector extender module having first terminals arranged within the channels, the first terminals being configured to receive the pins, the first terminals having tails configured to be terminated to a circuit board; and
a second connector extender module having a second holder having a second height between a connector end and a board end, the second height being less than the first height, the second holder having channels extending between the connector end and the board end, the second connector extender module having second terminals shorter than the first terminals arranged within the channels of the second holder, the second terminals being configured to receive the pins, the second terminals having tails configured to be terminated to the circuit board;
wherein one of the first connector extender module or the second connector extender module is selectively positioned between the electrical connector and the circuit board to control the vertical height of the mating end of the electrical connector from the circuit board.

16. The connector assembly of claim 15, wherein the channels extend along center lines, the channels being arranged in a footprint pattern the same as a footprint pattern of the pins.

17. The connector assembly of claim 15, wherein the contacts comprise signal contacts and power contacts, the signal contacts having different mating ends than the power contacts for mating with the mating connector, the signal contacts and the power contacts having similar pins, the terminals being configured to receive the pins of the signal contacts or the power contacts depending on the location of the terminal within the holder.

18. The connector assembly of claim 15, wherein the terminals have receptacles opposite the tails, the receptacles receive the pins.

19. The connector assembly of claim 15, wherein the electrical connector holds different types of contacts, the terminals being identical to one another and being configured to mate with the different types of contacts.

20. The connector assembly of claim 15, wherein the electrical connector has a mating interface at the mating end, when the first connector extender module is positioned between the electrical connector and the circuit board, the mating interface is positioned a first vertical height from the circuit board, and when the second connector extender module is positioned between the electrical connector and the circuit board, the mating interface is positioned a second vertical height from the circuit board that is less than the first vertical height.

* * * * *